United States Patent [19]

Campbell

[11] Patent Number: 5,796,050
[45] Date of Patent: Aug. 18, 1998

[54] FLEXIBLE BOARD HAVING ADHESIVE IN SURFACE CHANNELS

[75] Inventor: Jeffrey Scott Campbell, Binghamton, N.Y.

[73] Assignee: International Business Machines Corporation, Armonk, N.Y.

[21] Appl. No.: 796,010

[22] Filed: Feb. 5, 1997

[51] Int. Cl.[6] .................................................. H05K 1/03
[52] U.S. Cl. ........................... 174/255; 174/254; 174/259; 361/750; 156/275.3; 156/292
[58] Field of Search .................................. 174/254, 258, 174/259, 255, 250; 361/749, 750; 439/67, 77; 29/830; 156/292, 273.3, 275.5, 275.7

[56] References Cited

U.S. PATENT DOCUMENTS

| | | |
|---|---|---|
| 3,039,177 | 6/1962 | Burdett ...................... 29/848 |
| 4,985,600 | 1/1991 | Heerman . |
| 5,157,828 | 10/1992 | Coques et al. . |
| 5,415,555 | 5/1995 | Sobhani . |
| 5,486,655 | 1/1996 | Arike et al. . |
| 5,526,563 | 6/1996 | Tamaki et al. . |

OTHER PUBLICATIONS

IBM Technical Disclosure Bulletin; vol. 38, No. 02, Feb. 1995.

*Primary Examiner*—Bot L. Ledynh
*Assistant Examiner*—Kamand Cuneo
*Attorney, Agent, or Firm*—Pamela A. Docherty; Calfee, Halter & Griswold LLP

[57] ABSTRACT

A circuit board assembly which includes a flexible printed circuit bonded to a substrate by an adhesive that is curable upon exposure to actinic radiation of a preselected wavelength is provided. The flexible circuit includes a dielectric layer made from a material that is transmissive to actinic radiation of a preselected wavelength and a conductive layer disposed on a surface of the dielectric layer. The conductive layer has an opening therethrough to allow passage of the actinic radiation through the flexible circuit. Preferably, the opening is in the region of the conductive layer that lacks metal tracings. The substrate of the assembly includes a top surface defining a mating region and a channel and a side surface defining a port that is in communication with the channel. The channel of the substrate is aligned and coincident with the opening of the conductive layer. The adhesive is disposed within the channel. The mating region of the substrate is in direct contact with the flexible printed circuit such that there is little to no adhesive between the mating regions of the top surface of the substrate and the mating surface of the flexible circuit. Thus, the circuit board assemblies of the present invention may be thinner than their prior art counterparts that have an adhesive between the substrate and the flexible printed circuit. The present invention also relates to the flexible printed circuits of the circuit board assembly.

8 Claims, 2 Drawing Sheets

5,796,050

FLEXIBLE BOARD HAVING ADHESIVE IN SURFACE CHANNELS

FIELD OF THE INVENTION

This invention relates generally to a method of bonding a flexible circuit to a substrate to provide a circuit board assembly. More particularly, this invention relates to design features in the flexible circuit and in the substrate which eliminate the need for an adhesive layer between the mating surfaces of the flexible circuit and the substrate.

BACKGROUND OF THE INVENTION

Flexible printed circuits are widely used in consumer and industrial appliances and in appliances for telecommunications. Such circuits comprise a thin, flexible, dielectric layer with conductive layers carried on at least one surface or, more typically, on two opposing surfaces of the dielectric layer. Due to the thin nature of high performance flexible circuits, it is often necessary to adhesively bond such circuits to a support substrate, such as a carrier frame, to ensure that the circuits are not damaged during manufacture and/or use of the appliance. Accordingly, the resulting circuit board assembly comprises three layers with one layer being the flexible circuit, the second layer being the carrier frame, and the third layer being a layer of adhesive between the mating surfaces of the flexible circuit and the frame.

Even in those cases where the flexible circuit is not specifically attached to a carrier frame, it is usually attached to an adjoining substrate by means of an adhesive layer. Unfortunately, this has led to practical limitations in terms of the amount of space occupied by the resulting circuit board assembly since the adhesive layer itself represents a significant part of the thickness of the final product.

Numerous types of adhesives have been used to bond flexible circuits to carrier frames or to other types of substrates. They include pressure sensitive adhesives and single or two component adhesives which may also require cure by heating. Unfortunately, the pressure sensitive adhesives are difficult to handle and are relatively thick. Typically such adhesives have a thickness of at least 2 mils. In addition, there is variation in the thickness of the circuit board assemblies which use such adhesives, due in large part to a variation in the thickness of the pressure sensitive adhesive itself. Accordingly, pressure sensitive adhesives have a relatively limited usefulness in circuit board assemblies.

Heat-curable and air-curable adhesives, which are typically applied between the substrate and flexible circuit by a commercial dispensing machine, are somewhat easier to use but require a considerable amount of time to set. Accordingly, the use of such adhesives is not compatible with high volume production of circuit board assemblies. Moreover, such adhesives squeeze out when pressure is applied during the bonding process, thereby contaminating the outside of the product assembly and making it difficult to precisely control the thickness of the final adhesive layer and the overall thickness of the assembly.

Because of the continued trend towards miniaturization and because of a growing diversity in applications, there are increasingly more stringent requirements in terms of reducing the thickness of circuit board assemblies. Accordingly, a new method for bonding a flexible printed circuit to a substrate which eliminates the need to place an adhesive layer between the mating surfaces of the substrate and the flexible circuit would be highly desirable. A method which employs an adhesive that is easy to use and that requires less than a minute to cure is especially desirable.

SUMMARY OF THE INVENTION

In accordance with the present invention, a novel method for bonding a flexible circuit to a substrate is provided. The method uses an adhesive which is curable upon exposure to actinic radiation of a preselected wavelength. The method also uses a flexible circuit that comprises a dielectric layer made from a material that is transmissive to actinic radiation of the preselected wavelength, and at least one conductive layer disposed on a surface of the dielectric layer. The conductive layer has at least one opening therethrough so that at least one window comprising the actinic radiation-transmissive dielectric material is formed in the flexible circuit. The method also employs a substrate which comprises a top surface defining a mating region and at least one channel, and a side surface defining at least one port which is in communication with the channel. Preferably, the conductive layer has a plurality of openings therethrough which allow passage of the actinic radiation through the flexible circuit. Preferably, the top surface of the substrate defines a plurality of channels, more preferably a plurality of interconnecting channels. Preferably the pattern formed by the channels in the top surface of the substrate corresponds to the pattern formed by the windows of the flexible circuit.

In one embodiment, the method comprises the steps of dispensing the adhesive in the channels of the substrate; aligning the flexible circuit with the substrate such that at least a portion of one or more windows in the flexible circuit overlay a portion of one or more channels in the substrate; contacting the flexible circuit with the mating region of the substrate; and then directing actinic radiation through the windows of the flexible circuit for a sufficient time to cure the adhesive and to provide an adhesively-bonded circuit board assembly. In another embodiment, the flexible circuit is aligned with and placed on the mating region of substrate before the adhesive is injected into the channels of the substrate via the ports which are present in the side surface.

The present invention also relates to circuit board assemblies that are made in accordance with the present invention and to flexible circuits which are used to form such circuit board assemblies.

BRIEF DESCRIPTION OF THE DRAWINGS

The present invention may be more readily understood by reference to the drawings wherein.

DETAILED DESCRIPTION

In accordance with the present invention, a flexible circuit is adhesively bonded to a substrate by means of an adhesive that is curable upon exposure to actinic radiation to provide a circuit board assembly. As used herein, actinic radiation means radiation that initiates a chemical change in the adhesive when such radiation impinges upon the adhesive. The components of the circuit board assembly and the methods used to form the circuit board assembly are described below with reference to the drawings. The drawings depict one embodiment of a flexible circuit and a substrate which are used to make a circuit board assembly in accordance with the present invention.

The Flexible Printed Circuit

In accordance with the present invention, flexible circuit 10 comprises a dielectric layer 12 and at least one conductive layer disposed on a surface thereof. Preferably, two conductive layers 14 and 16 are plated on opposing surfaces of dielectric layer 12. Dielectric layer 12 is formed from a polymeric material which is transmissible to actinic radiation. Preferably, the polymeric substance is flexible and has a high dielectric strength. Polymeric substances which are transmissible to actinic radiation include, for example, polyimides, which are transmissible to visible light. One non-limiting example of a material which is flexible, has a high dielectric strength, and is transmissible to actinic radiation having a wavelength of between 400 and 700 nm is the polyimide KAPTON ®, sold by the Electronic Materials Division of Dupont, Research Triangle Park, N.C.

The conductive layers are formed from a conductive material such as, for example, copper, a copper alloy, palladium-coated and palladium-gold coated copper. Each of the conductive layers have at least one opening, preferably a plurality of openings 18–21, which typically are made in the conductive layers by either additive plating or subtractive plating. Typically, the openings are made in the regions of the conductive layer that lack metal tracings. Although the openings may be made in the contact pads or registration marks of the conductive layer, it is preferred that the openings are near or adjacent the perimeter of the conductive layer.

Figure 1:
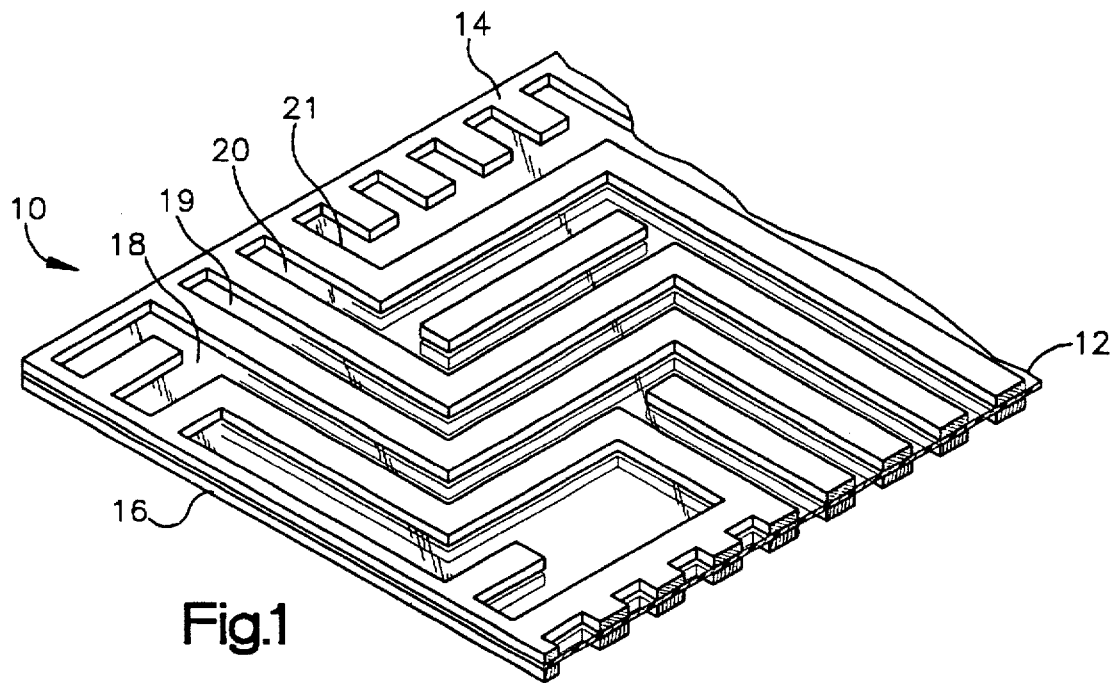
FIG. 1 is a perspective view, partially in cross-section, of a portion of a flexible circuit, shown generally as 10, which may be used to form a circuit board assembly in accordance with the present invention.

In those cases where a conductive layer is plated onto each of the opposing surfaces of the dielectric, it is essential that at least one of the openings in one of the conductive layers coincides with at least one of the openings in the other conductive layer so that at least one actinic radiation-transmissible window comprising the dielectric layer is formed in the flexible circuit. Preferably, as shown in FIG. 1, substantially all of the openings in conductive layer 14 coincide with all of the openings in conductive layer 16 such that a pattern of actinic radiation-transmissible windows are formed in flexible circuit 10.

The Substrate

Figure 2:
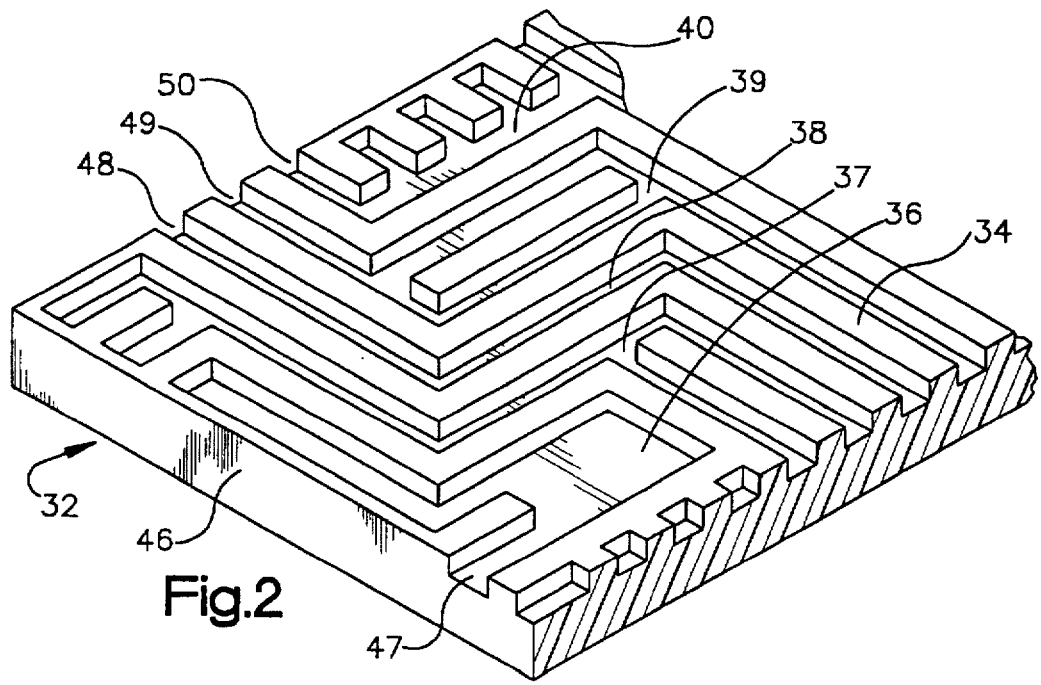
FIG. 2 is a perspective view, partially in cross-section, of a portion of a substrate, shown generally as 32, which may be used to form a circuit board assembly in accordance with the present invention.

In accordance with the present invention, substrate 32 comprises a top surface 34 which defines at least one mating region and at least one channel. Preferably, as shown in FIG. 2, a plurality of channels 36–40 are disposed throughout top surface 34. The purpose of channels 36–40 is to hold the adhesive. Accordingly, the total top surface area occupied by channels 36–40 and by mating regions 41–45 depends, at least in part, upon the amount of adhesive needed to effectively bond substrate 32 to flexible circuit 10. Although not necessary, it is preferred that the pattern formed by channels 36–40 in top surface 34 of substrate 32 be substantially similar to the pattern formed by the windows of flexible circuit 10. Preferably, channels 36–40 are dimensioned such that the width and length of channels 36–40 are substantially the same as the width and the length of the openings in flexible circuit 10. The depth of channels 36–40 depends upon the curing properties of the adhesive which is used to bond substrate 32 to flexible circuit 10. Typically, the depth of the channels is 0.1 to 0.2 mm. Substrate 32 also has a side surface 46, which defines at least one port which is in communication with at least one channel in substrate 32. Preferably, as shown in FIG. 2, substrate 32 comprises a plurality of ports 48–50 which are in communication with a plurality of the substrate channels.

Substrate 32 is formed from any material which can be adhesively bonded to flexible circuit 10. Thus, suitable materials include, for example metals, metals coated with elastomers, and plastics such as polyphenylene sulfide. Plastics are particularly useful for forming the carrier frames of circuit board assemblies, such as flexiposers, that are used in various high performance computers electrical connectors. Channels and ports typically are formed in substrate 32 by injection molding, machining, and/or chemical etching.

The Adhesive

In accordance with the present invention, adhesives which are cured upon exposure to actinic radiation are used to bond the flexible circuit to the substrate. The adhesives may be cured by exposure to visible light having a wavelength of 400–700 nm by exposure to ultraviolet light having a wavelength of 10–400 nm, by exposure to infra red radiation having a wavelength of 700 nm to 1 mm or by exposure to x-rays having a wavelength of 10 nm to $10 \times 10^{-3}$ nm. The radiation that is used to cure the adhesive must pass through the windows formed by the dielectric layer of flexible circuit 10. Accordingly, the adhesive and the material which is used to form dielectric layer 12 are selected to be curable by and transmissible to, respectively, actinic radiation of the same wavelength. Thus, when a material that is transmissible to visible light is used to make the dielectric layer of the flexible circuit, it is preferred that an adhesive curable by exposure to light having a wavelength from 400 nm to 700 nm be used to bond the flexible circuit to the substrate. Adhesives which are cured by actinic radiation include, for example, acrylics and epoxy-based adhesives, and may further include photoinitiators which initiate curing of the adhesive upon exposure to light of a particular wavelength. One non-limiting example of an actinic radiation-curable adhesive which is curable upon exposure to either visible light or ultraviolet light is the adhesive Eccobond UV9110 available from Grace Specialty Polymers, Lexington, Mass.

Typically, adhesives which are cured by exposure to actinic radiation are fully-cured within seconds after irradiation is begun. In contrast, other types of curing adhesives, particularly adhesives which are cured by exposure to air or heat, typically require more than one minute to cure. Thus, the amount of time needed to produce circuit board assemblies in accordance with the present method is considerably reduced as compared to methods which use other types of curing adhesives to bond flexible circuits to substrates.

Fabricating the Circuit Board Assembly

Embodiment 1

Figure 3:
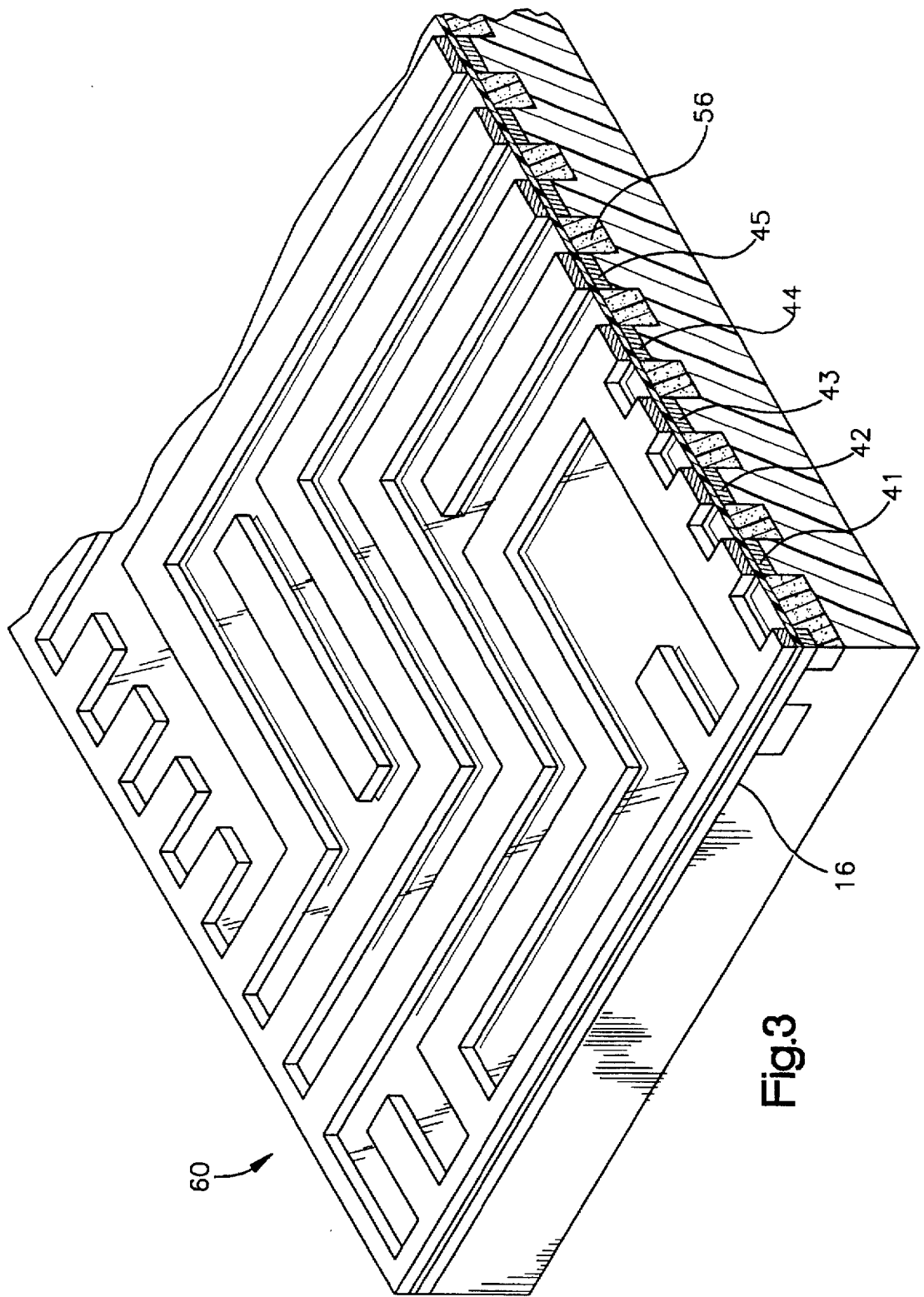
FIG. 3 is a perspective view, partially in cross-section, of a portion of a circuit board assembly, shown generally as 60, which is produced in accordance with the present invention.

In accordance with the present invention, a circuit board assembly, shown generally as 60 in FIG. 3, is fabricated by bonding flexible circuit 10 to substrate 32 by adhesive 56. In one embodiment, circuit board assembly 60 is made by first dispensing adhesive 56 in channels 36–40 of substrate 32. Then flexible circuit 10 is aligned with and placed on substrate 32 such that at least one, preferably a plurality, of the windows in the flexible circuit coincide with and overlay at least one, preferably a plurality, of the channels in the substrate. Since cure can typically propagate into areas of the adhesive which are not exposed to the actinic radiation, it is not essential that all of the windows in the flexible circuit coincide with and overlay all of the channels in the substrate. Nonetheless, as shown in FIG. 3, it is preferred that substantially all of openings 18–21 in flexible circuit 10 coincide with and overlay substantially all of the channels 36–40 in substrate 32. Typically, alignment is accomplished by aligning a pin which has been molded into the top surface of the substrate with a matching hole which has been formed in the flexible circuit. A sufficient amount of controlled pressure is then applied to flexible circuit 10 and substrate 32 to bring the mating region of top surface 34 of substrate 32 into direct contact with the flexible circuit. As depicted in FIG. 3, mating regions 41–45 of top surface 34 of substrate 32 are in direct contact with conductive layer 16 of flexible circuit 10. In those cases where one conductive layer is disposed on the dielectric layer, the mating region of the top surface of the substrate may be in direct contact with either the conductive layer or the dielectric layer. As shown in FIG. 3, adhesive 56 is in contact with the portions of dielectric layer 12 that form the windows of flexible circuit 10. Typically, pressure is applied to the substrate and flexible circuit using an assembly fixture having a clear glass pressure foot which is placed on the flexible circuit. As pressure is applied, adhesive spreads throughout the network of channels 36–40 and any excess adhesive 56 which cannot be contained therein flows out of the channels through ports 48–50. Advantageously, this prevents the accumulation of adhesive between the mating regions of the top surface 34 of substrate 32 and the mating surface of the flexible circuit. Thereafter, actinic radiation having a wavelength that is transmissible by dielectric layer 12 and capable of curing adhesive 56 is directed through the openings of the conductive layers, through the windows formed by the dielectric layer and onto the adhesive. For example, when KAPTON ® is used to form dielectric layer 12 and the adhesive Eccobond UV9110 is dispensed in channels 36–40, light at a wavelength of between 200 and 700 nm is used to cure the adhesive. Preferably, pressure is continuously applied to the substrate and flexible circuit throughout the entire time the adhesive is being irradiated. Typically, irradiation is accomplished by means of an artificial light source which is integrated into the assembly fixture and which transmits light through the clear glass foot. Depending upon the type of adhesive used, irradiation is continued for a sufficient time to either initiate cure or to fully cure adhesive 56 and to produce circuit board assembly 60.

Embodiment 2

In another embodiment, circuit board assembly 60 is made by placing flexible circuit 10 on substrate 32 prior to dispensing adhesive 56 in channels 36–40. Preferably, as shown in FIG. 3, flexible circuit 10 is positioned on substrate 32 such that substantially all of the openings 18–22 in flexible circuit 10 coincide with and overlay substantially all of the channels 36–40 in substrate 32. Then adhesive 56 is injected into channels 36–40 by means of ports 48–50 until adhesive 56 substantially fills channels 36–40 and comes into contact with the portions of dielectric layer 12 which comprise the windows of flexible circuit 10. Thereafter, pressure is applied to the resulting composite structure to bring the mating regions of top surface 34 of substrate 32 into close contact with the mating surface of the flexible circuit and to squeeze out any excess adhesive which is present in channels 36–40. Then adhesive 56 is irradiated through the windows of flexible circuit 10 to cure adhesive 56 and to form circuit board assembly 60.

In accordance with the present invention, there is little to no adhesive between the mating regions of the top surface of the substrate and the mating surface the flexible circuit. Therefore, the circuit board assemblies made in accordance with the present invention may be thinner than their prior art counterparts. In addition the overall thickness of these final circuit board assemblies can be more closely controlled due to the absence of an intervening adhesive layer. Finally, circuit board assemblies made in accordance with the present invention require less time to produce than their prior art counterparts which typically use adhesives that require more than one minute to cure.

While the invention has been described to some degree of particularity, various adaptations and modifications can be made without departing from the scope of the invention as defined in the appended claims.

What is claimed is:

1. A circuit board assembly comprising:
   a) a substrate comprising:
      i) a top surface defining a mating region and a channel, wherein the portion of the top surface defining the mating region and the portion of the top surface defining the channel are formed from the same material;
      ii) a side surface having disposed therein a port in communication with the channel;
   b) a flexible circuit in direct contact with the mating region of said substrate, said flexible circuit comprising:
      i) a dielectric layer that is transmissible to actinic radiation of a preselected wavelength, said dielectric layer having two opposing surfaces; and
      ii) a conductive layer disposed on one of said two opposing surfaces of the dielectric layer, said conductive layer having an opening therethrough for allowing passage of the actinic radiation through said flexible circuit; and
   c) an adhesive cured by actinic radiation of the preselected wavelength; said adhesive being disposed in the channel of said substrate and in contact with the dielectric layer of said flexible circuit; wherein substantially no adhesive is present between the mating region of the top surface of said substrate and said flexible circuit.

2. The printed circuit board assembly of claim 1 wherein said substrate is formed from a metal.

3. The printed circuit board assembly of claim 1 wherein said substrate is formed from a metal coated with an elastomer.

4. The circuit board assembly of claim 1 wherein said top surface of said substrate further defines a plurality of said channels, said plurality of said channels forming a first pattern;
   wherein said conductive layer has a plurality of said openings, said plurality of said openings forming a second pattern; and
   wherein the second pattern formed by said plurality of said openings in said conductive layer substantially corresponds to the first pattern formed by said plurality of said channels so that each of said channels is aligned with one of said opening in said conductive layer.

5. The circuit board assembly of claim 1 wherein
   said conductive layer has a perimeter and a plurality of said openings; and
   wherein said plurality of said openings in said conductive layer are adjacent said perimeter.

6. The circuit board assembly of claim 1 wherein said flexible circuit further comprises a second conductive layer disposed on the other of said two opposing surfaces of the dielectric layer; and wherein said adhesive is in contact with a portion of one of said two opposing surfaces of said dielectric layer.

7. The printed circuit board assembly of claim 1 wherein said dielectric layer is transmissible to visible light and wherein said adhesive is cured by exposure to visible light.

8. The printed circuit board assembly of claim 7 wherein said substrate is formed from a plastic.

* * * * *

UNITED STATES PATENT AND TRADEMARK OFFICE
CERTIFICATE OF CORRECTION

PATENT NO. : 5,796,050
DATED : August 18, 1998
INVENTOR(S) : JEFFREY SCOTT CAMPBELL It is certified that error appears in the above-indentified patent and that said Letters Patent is hereby corrected as shown below:

On the title page, item [54] and Col. 1,
In the title, after "FLEXIBLE" please add --CIRCUIT--.

Signed and Sealed this

Twelfth Day of January, 1999

Attest:

Attesting Officer

*Acting Commissioner of Patents and Trademarks*